United States Patent
Yang et al.

(10) Patent No.: US 8,044,401 B2
(45) Date of Patent: Oct. 25, 2011

(54) THIN FILM TRANSISTOR, METHOD OF FABRICATING THE SAME, ORGANIC LIGHT EMITTING DIODE DISPLAY DEVICE INCLUDING THE SAME AND METHOD OF FABRICATING THE SAME

(75) Inventors: Tae-Hoon Yang, Suwon-si (KR); Byoung-Keon Park, Suwon-si (KR); Jin-Wook Seo, Suwon-si (KR); Ki-Yong Lee, Suwon-si (KR); Kil-Won Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 92 days.

(21) Appl. No.: 12/163,074

(22) Filed: Jun. 27, 2008

(65) Prior Publication Data
US 2009/0001380 A1    Jan. 1, 2009

(30) Foreign Application Priority Data

Jun. 27, 2007 (KR) .................. 10-2007-0063680

(51) Int. Cl.
*H01L 29/76*  (2006.01)
*H01L 31/036* (2006.01)
*H01L 31/112* (2006.01)
*H01L 29/04*  (2006.01)
(52) U.S. Cl. .......................................... 257/66; 257/72
(58) Field of Classification Search .................. 257/66, 257/72, E21.413, E29.003
See application file for complete search history.

(56) References Cited

U.S. PATENT DOCUMENTS

| | | | |
|---|---|---|---|
| 5,851,860 A * | 12/1998 | Makita et al. ................. | 438/166 |
| 6,066,518 A   | 5/2000  | Yamazaki | |
| 6,162,667 A   | 12/2000 | Funai et al. | |
| 6,346,437 B1  | 2/2002  | Maekawa et al. | |
| 6,376,862 B1  | 4/2002  | Yamazaki | |
| 6,528,820 B1  | 3/2003  | Yamazaki et al. | |
| 6,888,304 B2 * | 5/2005 | Sato .............................. | 313/498 |

(Continued)

FOREIGN PATENT DOCUMENTS
CN   1494164 A   5/2004
(Continued)

OTHER PUBLICATIONS

Korean Notice of Allowability issued Nov. 28, 2008 in Korean Patent Application No. 2007-63680.
(Continued)

*Primary Examiner* — William M. Brewster
(74) *Attorney, Agent, or Firm* — H.C. Park & Associates, PLC

(57) ABSTRACT

A thin film transistor includes a substrate, a semiconductor layer disposed on the substrate, including a channel region and source and drain regions and crystallized using a metal catalyst, a gate electrode disposed to correspond to a predetermined region of the semiconductor layer, a gate insulating layer disposed between the gate electrode and the semiconductor layer to insulate the semiconductor layer from the gate electrode, and source and drain electrodes electrically connected to the source and drain regions of the semiconductor layer, respectively. The metal catalyst within 150 Å from a surface of the semiconductor layer in a vertical direction is formed to have a concentration exceeding 0 and not exceeding $6.5 \times E^{17}$ atoms per $cm^3$ in the channel region of the semiconductor layer. An organic light emitting diode (OLED) display device includes the thin film transistor.

12 Claims, 6 Drawing Sheets

U.S. PATENT DOCUMENTS

| | | |
|---|---|---|
| 2002/0094612 A1 | 7/2002 | Nakamura et al. |
| 2002/0164843 A1 | 11/2002 | Yamazaki et al. |
| 2004/0072393 A1* | 4/2004 | Yamazaki et al. ............ 438/149 |
| 2004/0084675 A1 | 5/2004 | Koyama et al. |
| 2006/0030085 A1 | 2/2006 | Park et al. |
| 2006/0073648 A1* | 4/2006 | Park et al. .................... 438/166 |
| 2006/0131583 A1 | 6/2006 | Ohtani et al. |

FOREIGN PATENT DOCUMENTS

| | | |
|---|---|---|
| CN | 1753151 A | 3/2006 |
| EP | 0 651 431 | 5/1995 |
| JP | 2002-110543 | 12/2002 |
| JP | 2003-100633 | 4/2003 |
| JP | 2004-104110 | 4/2004 |
| KR | 2002-90429 | 12/2002 |
| KR | 2005-117467 | 12/2005 |
| KR | 2006-12850 | 2/2006 |
| KR | 2006-18533 | 3/2006 |

OTHER PUBLICATIONS

Chinese Office Action issued on Sep. 11, 2009 in the corresponding Chinese Patent Application No. 200810131753.0.

* cited by examiner

FIG. 3A

| DEPTH (Å) | CONCENTRATION OF METAL CATALYST (Atoms per cm³) |
|---|---|
| 10 | $2.15 \times E16$ |
| 20 | $2.88 \times E16$ |
| 30 | $3.43 \times E16$ |
| 40 | $3.68 \times E16$ |
| 50 | $3.83 \times E16$ |
| 60 | $4.30 \times E16$ |
| 70 | $4.76 \times E16$ |
| 80 | $4.98 \times E16$ |
| 90 | $4.88 \times E16$ |
| 100 | $5.01 \times E16$ |
| 110 | $4.93 \times E16$ |
| 120 | $4.96 \times E16$ |
| 130 | $4.90 \times E16$ |
| 140 | $4.92 \times E16$ |
| 150 | $4.97 \times E16$ |
| 160 | $4.67 \times E16$ |
| 170 | $4.71 \times E16$ |
| 180 | $4.48 \times E16$ |
| 190 | $4.53 \times E16$ |
| 200 | $4.13 \times E16$ |
| 210 | $4.50 \times E16$ |
| 220 | $4.56 \times E16$ |
| 230 | $4.10 \times E16$ |
| 240 | $4.05 \times E16$ |
| 250 | $4.17 \times E16$ |
| 260 | $3.95 \times E16$ |
| 270 | $3.96 \times E16$ |
| 280 | $3.79 \times E16$ |
| 290 | $4.01 \times E16$ |
| 300 | $3.82 \times E16$ |
| 310 | $3.90 \times E16$ |
| 320 | $3.80 \times E16$ |
| 330 | $3.94 \times E16$ |
| 340 | $4.95 \times E16$ |
| 350 | $4.01 \times E16$ |
| 360 | $4.85 \times E16$ |
| 370 | $4.99 \times E16$ |
| 380 | $5.20 \times E16$ |
| 390 | $5.45 \times E16$ |
| 400 | $5.68 \times E16$ |

THIN FILM TRANSISTOR, METHOD OF FABRICATING THE SAME, ORGANIC LIGHT EMITTING DIODE DISPLAY DEVICE INCLUDING THE SAME AND METHOD OF FABRICATING THE SAME

CROSS-REFERENCE TO RELATED APPLICATION

This application claims the benefit of Korean Patent Application No. 2007-63680, filed Jun. 27, 2007 in the Korean Intellectual Property Office, the disclosure of which is incorporated herein by reference.

BACKGROUND OF THE INVENTION

1. Field of the Invention

Aspects of the present invention relate to a thin film transistor, a method of fabricating the same, and an organic light emitting diode (OLED) display device including the same. More particularly, aspects of the present invention relate to a thin film transistor, in which the concentration of a metal catalyst is adjusted according to the location of a channel region of a semiconductor layer, which is crystallized using a metal catalyst, so that electrical characteristics are excellent, a method of fabricating the same, and an OLED display device including the same.

2. Description of the Related Art

Generally, a polycrystalline silicon layer can be used in a high field effect mobility and high operating circuit, and can constitute a CMOS circuit. Therefore, a polycrystalline silicon layer is widely used for a semiconductor layer of a thin film transistor. The thin film transistor using a polycrystalline silicon layer is generally used for an active element of an Active Matrix Liquid Crystal Display (AMLCD), and a switching element and a driving element of an organic light emitting diode (OLED).

Methods of crystallizing amorphous silicon into polycrystalline silicon include a solid phase crystallization (SPC) method, an excimer laser crystallization (ELC) method, a metal induced crystallization (MIC) method, and a metal induced lateral crystallization (MILC) method. In the SPC method, an amorphous silicon layer is annealed for hours or tens of hours at a temperature of about 700° C. or less, i.e., less than a transition temperature of glass that forms a substrate of a display device in which a thin film transistor is used. In the ELC method, an excimer laser is irradiated onto a silicon layer to locally heat the silicon layer for a very short time period at a high temperature, so that the silicon layer is crystallized. In the MIC method, metals such as nickel, palladium, gold, aluminum, etc., are placed in contact with an amorphous silicon layer or are injected, so that the amorphous silicon layer is changed into a polycrystalline silicon layer, i.e., a phase change is induced. In the MILC method, silicide, which is generated by reacting metal with silicon, is laterally and continuously diffused to sequentially induce crystallization of the amorphous silicon layer.

However, the SPC method takes a long process time, and the annealing process performed at a high temperature for a long time carries a risk of deformation of a substrate. Also, in the ELC method, a high-priced laser device is required, and a protrusion is created on the polycrystalline surface, so that interfacial characteristics between a semiconductor layer and a gate insulating layer may be inferior.

At present, since in a method of crystallizing an amorphous silicon layer using a metal, crystallization can be achieved at a lower temperature and with less time consumption than in the SPC method, research into crystallization methods using metals is actively progressing. Methods of crystallizing an amorphous silicon layer using a metal includes an MIC method, an MILC method, and a Super Grain Silicon (SGS) crystallization method.

One of the factors determining the characteristics of a thin film transistor is leakage current. In particular, in a semiconductor layer that is crystallized using a metal catalyst, the metal catalyst may remain in a channel region to increase the leakage current. Therefore, unless the concentration of the metal catalyst in the channel region is controlled to a predetermined concentration or less, the leakage current of the thin film transistor may be increased and the electrical characteristics of the channel region may be worsened.

SUMMARY OF THE INVENTION

Aspects of the present invention provide a thin film transistor having excellent electrical characteristics, in which the concentration of a metal catalyst is adjusted depending on the location of a channel region of a semiconductor layer, which is crystallized by the metal catalyst, a method of fabricating the same, and an organic light emitting diode (OLED) display device.

According to an embodiment of the present invention, a thin film transistor includes: a substrate; a semiconductor layer disposed on the substrate, including a channel region and source and drain regions, and crystallized using a metal catalyst; a gate electrode disposed to correspond to a predetermined region of the semiconductor layer; a gate insulating layer disposed between the gate electrode and the semiconductor layer to insulate the semiconductor layer from the gate electrode; and source and drain electrodes electrically connected to the source and drain regions of the semiconductor layer, wherein the metal catalyst is present in the channel region of the semiconductor layer at a concentration exceeding 0 and not exceeding $6.5 \times E^{17}$ atoms per $cm^3$ within 150 Å in a vertical direction from a surface of the semiconductor layer.

According to another aspect to the present invention, a method of fabricating a thin film transistor includes: forming a substrate; forming a semiconductor layer including a channel region and source and drain regions on the substrate, the semiconductor layer being crystallized using a metal catalyst; forming a gate electrode disposed to correspond to a predetermined region of the semiconductor layer; forming a gate insulating layer between the gate electrode and the semiconductor layer to insulate the semiconductor layer from the gate electrode; and forming source and drain electrodes electrically connected to source and drain regions of the semiconductor layer, respectively; wherein the metal catalyst is present in the channel region of the semiconductor layer at a concentration exceeding 0 and not exceeding $6.5 \times E^{17}$ atoms per $cm^3$ within 150 Å in a vertical direction from a surface of the semiconductor layer.

According to still another aspect of the present invention, an organic light emitting diode (OLED) display device includes: a substrate; a semiconductor layer disposed on the substrate, including a channel region and source and drain regions, and crystallized using a metal catalyst; a gate electrode disposed to correspond to the channel region of the semiconductor layer; a gate insulating layer disposed between the gate electrode and the semiconductor layer to insulate the semiconductor layer from the gate electrode; source and drain electrodes electrically connected to the source and drain regions of the semiconductor layer, respectively; a first electrode electrically connected to one of the source and drain electrodes; an organic layer including a light emitting layer disposed on the first electrode; and a second electrode disposed on the organic layer, wherein the metal catalyst is present in the channel region of the semiconductor layer at a concentration exceeding 0 and not exceeding 6.5×$E^{17}$ atoms per $cm^3$ within 150 Å in a vertical direction from a surface of the semiconductor layer.

According to yet another aspect of the present invention, a method of fabricating an OLED display device includes: forming a substrate; forming a semiconductor layer including a channel region and source and drain regions on the substrate, the semiconductor layer being crystallized using a metal catalyst; forming a gate electrode disposed to correspond to a predetermined region of the semiconductor layer; forming a gate insulating layer between the gate electrode and the semiconductor layer to insulate the semiconductor layer from the gate electrode; forming source and drain electrodes electrically connected the source and drain regions of the semiconductor layer; forming a first electrode electrically connected to one of the source and drain electrodes; forming an organic layer including a light emitting layer on the first electrode; and forming a second electrode on the organic layer, wherein the metal catalyst is present in the channel region of the semiconductor layer at a concentration exceeding 0 and not exceeding 6.5×$E^{17}$ atoms per $cm^3$ within 150 Å in a vertical direction from a surface of the semiconductor layer.

According to another embodiment of the present invention, a semiconductor layer of a thin film transistor includes a channel region and source and drain regions, and crystallized using a metal catalyst; wherein the metal catalyst is present in the channel region of the semiconductor layer at a concentration exceeding 0 and not exceeding 6.5×$E^{17}$ atoms per $cm^3$ within 150 Å from a surface of the semiconductor layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
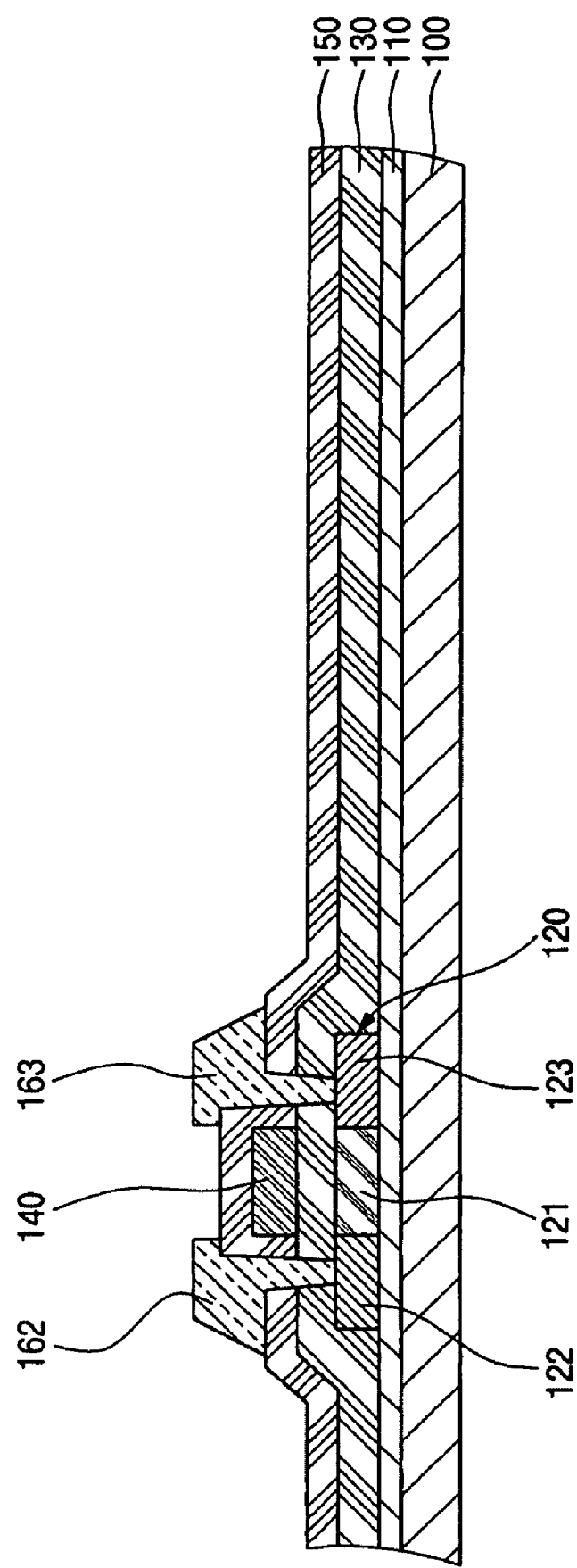
FIG. 1 is a cross-sectional view of a thin film transistor according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Herein, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

FIG. 1 is a cross-sectional view of a thin film transistor according to an embodiment of the present invention.

Referring to FIG. 1, a substrate 100 is provided. The substrate 100 may be formed of glass or plastic. A buffer layer 110 may be disposed on the substrate 100. The buffer layer 110 serves to prevent diffusion of moisture or impurities generated in the substrate 100 and to control a heat transfer rate in crystallization such that an amorphous silicon layer can be easily crystallized. The buffer layer 110 may be formed of a single layer using an insulating layer such as a silicon oxide layer and a silicon nitride layer or a multilayer thereof.

A patterned semiconductor layer 120 is disposed on the buffer layer 110. The semiconductor layer 120 is a semiconductor layer crystallized by a method using a metal catalyst such as an MIC method, an MILC method, or an SGS method, and includes a channel region 121, and source and drain regions 122 and 123. For example, the semiconductor layer 120 may be crystallized by an SGS method such that the concentration of the metal catalyst that diffuses to the amorphous silicon layer is controlled to be low.

The SGS method is a crystallization method in which the concentration of metal catalyst that is diffused into the amorphous silicon layer is controlled to be low, so that the grain size is controlled to several μm to hundreds of μm. As an example, a capping layer may be formed on the amorphous silicon layer, a metal catalyst layer may be formed on the capping layer and an annealing process may be performed to diffuse the metal catalyst such that the capping layer provides control over the diffusion of the metal catalyst. Alternatively, the concentration of the metal catalyst may be controlled to be low in the amorphous silicon layer by forming the metal catalyst layer to have a low concentration without forming the capping layer.

According to an aspect of the present invention, the metal catalyst exists at a concentration exceeding 0 and not exceeding 6.5×$E^{17}$ atoms per $cm^3$ within 150 Å from a surface of the semiconductor layer in a vertical direction in the channel region 121 of the semiconductor layer 120. As used herein, the term "vertical direction" refers to a direction perpendicular to the surface of the semiconductor layer and more specifically, to a direction extending from the surface of the semiconductor layer that is on an opposite side of the substrate towards the substrate.

Figure 2:
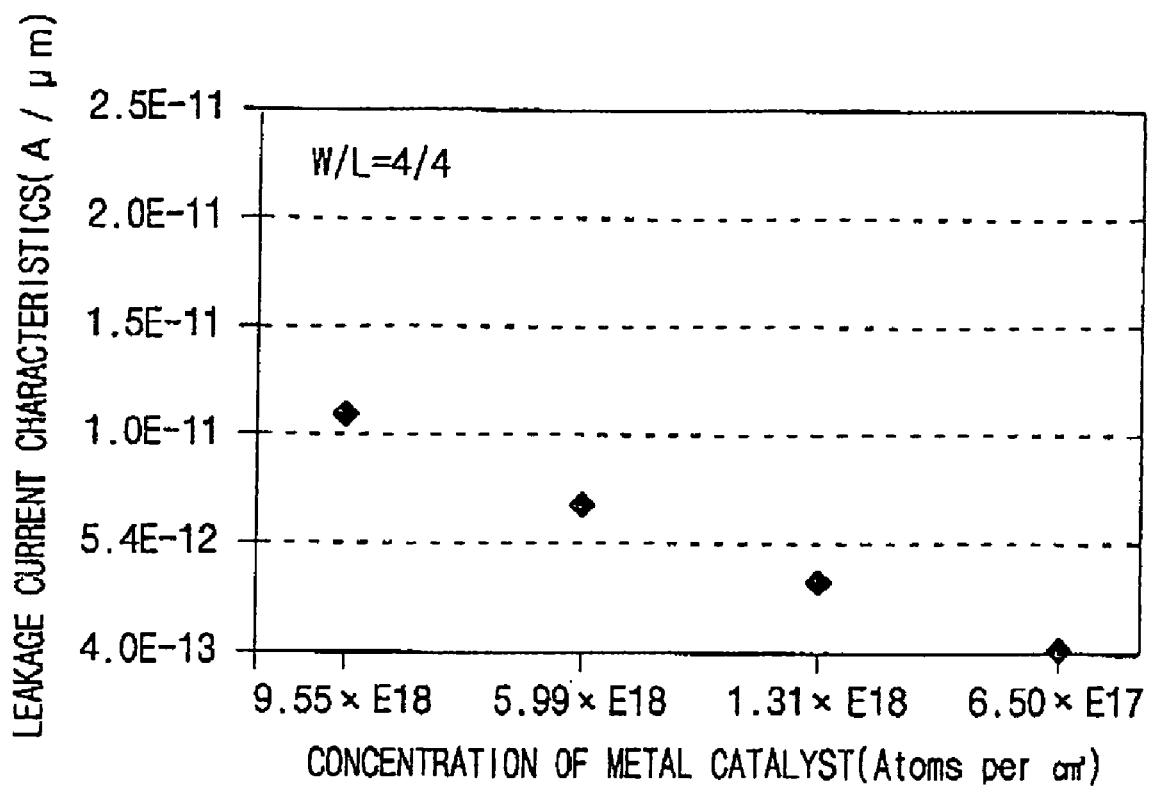
FIG. 2 is a graph of leakage current versus concentration of a metal catalyst existing in a channel region of a semiconductor layer that was crystallized using a metal catalyst.

FIG. 2 is a graph of leakage current versus concentration of a metal catalyst existing in a channel region of a semiconductor layer that is crystallized using the metal catalyst. Here, a concentration (atoms per $cm^3$) of a metal catalyst is plotted on the horizontal axis, and a current leakage value $I_{off}$(A/μm) per unit length 1 μm is plotted on the vertical axis.

Referring to FIG. 2, when the concentration of the metal catalyst is 9.55×$E^{18}$, 5.99×$E^{18}$ or 1.31×$E^{18}$ atoms per $cm^3$, which exceeds 6.5×$E^{17}$ atoms per $cm^3$, it is observed that a current leakage value $I_{off}$(A/μm) per unit length 1 μm is 1.0 $E^{-12}$ A/μm or higher. However, when the concentration of the metal catalyst is $6.5 \times E^{17}$ atoms per cm³ or lower, it is observed that the current leakage value $I_{off}$ (A/μm) per unit length 1 μm is $4.0 \, E^{-13}$ A/μm or lower. An important factor determining the characteristics of a thin film transistor is leakage current, and when the leakage current is maintained at a current leakage value $I_{off}$ (A/μm) per unit length 1 μm of $E^{-13}$ A/μm order or lower, the thin film transistor can have excellent electrical characteristics. Therefore, in order to fabricate a thin film transistor exhibiting excellent electrical characteristics, a metal catalyst in a channel region of a semiconductor layer may be controlled to have a concentration of $6.5 \times E^{17}$ atoms per cm³ or lower.

Figure 3:
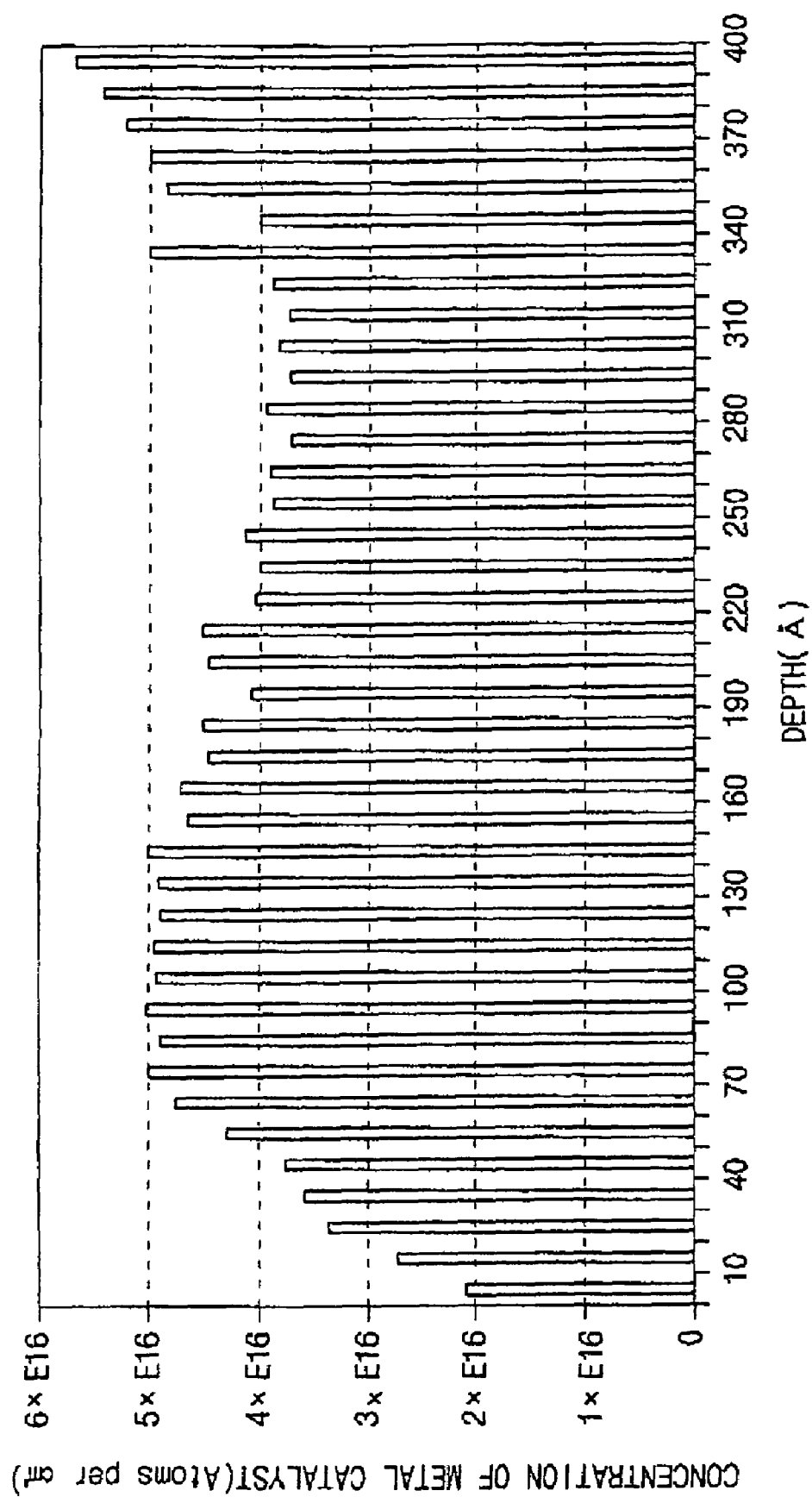
FIG. 3A is a table illustrating a concentration value of a metal catalyst with respect to a depth from a surface of a semiconductor layer in a vertical direction and is measured using surface concentration measuring equipment, in a thin film transistor having a current leakage value $I_{off}$(A/μm) per unit length 1 μm of 4.0 $E^{13}$ A/μm or lower in FIG. 2.
FIG. 3B is a graph of concentration values versus depth provided in the table of FIG. 3A.

FIG. 3A is a table illustrating a concentration value of a metal catalyst that corresponds to each depth from a surface of a semiconductor layer in a vertical direction and is measured using surface concentration measuring equipment, in a thin film transistor having a current leakage value $I_{off}$ (A/μm) per unit length 1 μm of $4.0 \, E^{-13}$ A/μm or lower in FIG. 2, and FIG. 3B is a graph of concentration value versus depth. A depth (Å) in a vertical direction from a surface of a semiconductor layer is plotted on the horizontal axis, and a concentration (atoms per cm³) of a metal catalyst is plotted on the vertical axis.

Referring to FIGS. 3A and 3B, in the thin film transistor having a current leakage value $I_{off}$ (A/μm) per unit length 1 μm of $4.0 \, E^{-13}$ A/μm or lower in FIG. 2, calculating the total concentration of the metal catalyst existing from a surface of the semiconductor layer in a vertical direction, it is observed that the total concentration of the metal catalyst existing within 150 Å from the surface of the semiconductor layer in a vertical direction is $6.5 \times E^{17}$ atoms per cm³. Also, it is observed that the total concentration of the metal catalyst at a point exceeding 150 Å from the surface of the semiconductor layer in a vertical direction exceeds $6.5 \times E^{17}$ atoms per cm³. Nevertheless, the electrical characteristics are still excellent. Accordingly, it can be confirmed that the concentration of the metal catalyst at a point exceeding 150 Å in a vertical direction rarely has an effect on the determination of the leakage current characteristics of a thin film transistor.

Therefore, referring to FIGS. 2, 3A and 3B, in order to fabricate a thin film transistor of excellent electrical characteristics capable of maintaining a current leakage value $I_{off}$ (A/μm) per unit length 1 μm of $E^{-13}$ A/μm order or lower, the concentration of a metal catalyst in a channel region of a semiconductor layer should be controlled to be $6.5 \times E^{17}$ atoms per cm³ or lower, and in particular, the concentration of the metal catalyst within 150 Å from the surface of the semiconductor layer in a vertical direction should be controlled to be $6.5 \times E^{17}$ atoms per cm³ or lower.

Referring again to FIG. 1, after the semiconductor layer 120 is formed, a gate insulating layer 130 is disposed on the entire surface of the substrate including the semiconductor layer 120. The gate insulating layer 130 may be a silicon oxide layer, a silicon nitride layer or a combination thereof.

A gate electrode 140 is disposed on the gate insulating layer 130 to correspond to a predetermined region of the semiconductor layer 120. The gate electrode 140 may be formed of a single layer of aluminum (Al) or an aluminum alloy such as aluminum-neodymium (Al—Nd) or a multilayer, in which an aluminum alloy is stacked on a chrome (Cr) or molybdenum (Mo) alloy.

An interlayer insulating layer 150 is disposed on the entire surface of the substrate 100 including the gate electrode 140. The interlayer insulating layer 150 may be a silicon nitride layer, a silicon oxide layer or a combination thereof.

Source and drain electrodes 162 and 163 electrically connected to the source and drain regions 122 and 123 of the semiconductor layer 120 are disposed on the interlayer insulating layer 150. The source and drain electrodes 162 and 163 may be formed of one selected from the group consisting of molybdenum (Mo), chrome (Cr), tungsten (W), molybdenum-tungsten (MoW), aluminum (Al), aluminum-neodymium (Al—Nd), titanium (Ti), titanium-nitride (TiN), copper (Cu), a molybdenum (Mo) alloy, an aluminum (Al) alloy, and a copper (Cu) alloy. As a result, a thin film transistor according to an embodiment is fabricated.

Figure 4:
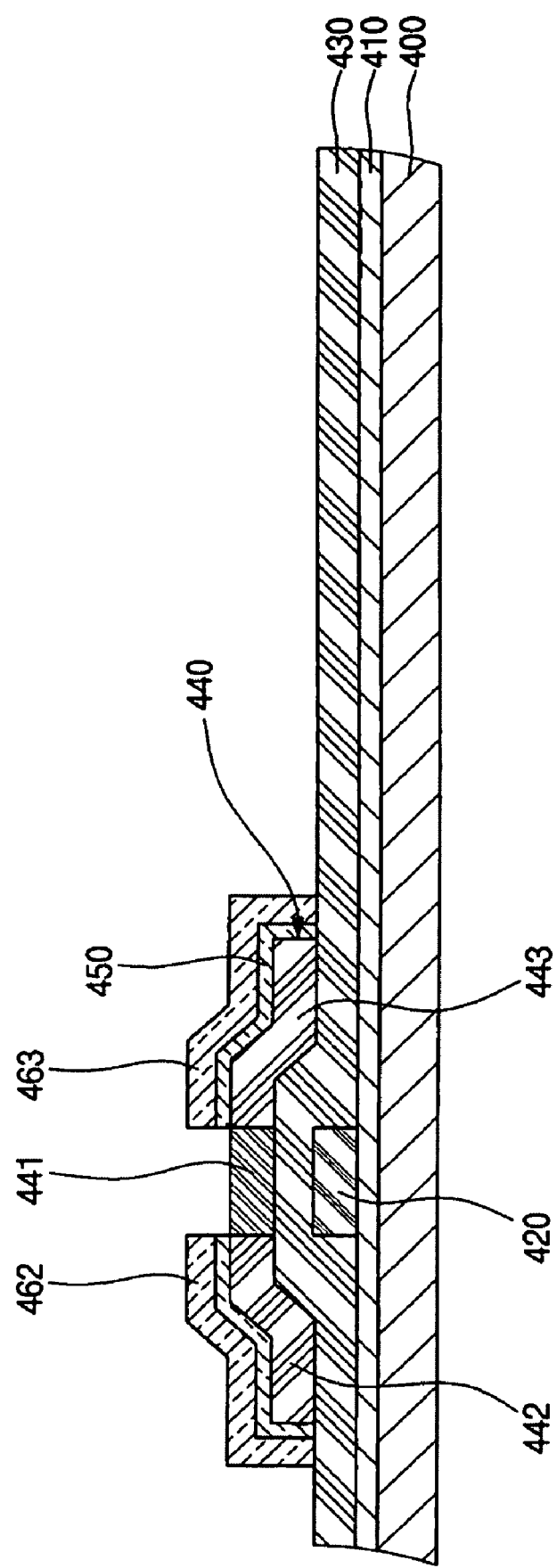
FIG. 4 is a cross-sectional view of a thin film transistor according to another embodiment of the present invention.

FIG. 4 is a cross-sectional view of a thin film transistor according to another embodiment of the present invention.

Referring to FIG. 4, a substrate 400 is prepared. A buffer layer 410 may be disposed on the substrate 400. A gate electrode 420 is disposed on the buffer layer 410. A gate insulating layer 430 is disposed on the gate electrode 420.

A patterned semiconductor layer 440 is disposed on the gate insulating layer 430. The semiconductor layer 440 is a semiconductor layer crystallized by a method using a metal catalyst such as an MIC method, an MILC method, or an SGS method, and includes a channel region 441, and source and drain regions 442 and 443. The semiconductor layer 440 may be crystallized by the SGS method such that the concentration of the metal catalyst that diffuses into the amorphous silicon layer is low.

The metal catalyst is present at a concentration of $6.5 \times E^{17}$ per cm³ or lower within 150 Å from a surface of the semiconductor layer 440 in a vertical direction in the channel region 441 of the semiconductor layer 440. As described in the embodiment of FIG. 1, referring to FIGS. 2, 3A and 3B, in order to fabricate a thin film transistor of excellent electrical characteristics capable of maintaining at a current leakage value $I_{off}$ (A/μm) per unit length 1 μm of $E^{-13}$ A/μm order or lower, the concentration of a metal catalyst in a channel region of a semiconductor layer should be controlled to be $6.5 \times E^{17}$ atoms per cm³ or lower, and in particular, the concentration of a metal catalyst within 150 Å from the surface of the semiconductor layer in a vertical direction may be controlled to be $6.5 \times E^{17}$ atoms per cm³ or lower.

Sequentially, source and drain electrodes 462 and 463 electrically connected to the source and drain regions 442 and 443 are disposed on the semiconductor layer 440. An ohmic contact layer 450 may be disposed between the semiconductor layer 440 and the source and drain electrodes 462 and 463. The ohmic contact layer 450 may be an amorphous silicon layer into which impurities are doped.

As a result, a thin film transistor according to the embodiment of FIG. 4 is fabricated.

Figure 5:
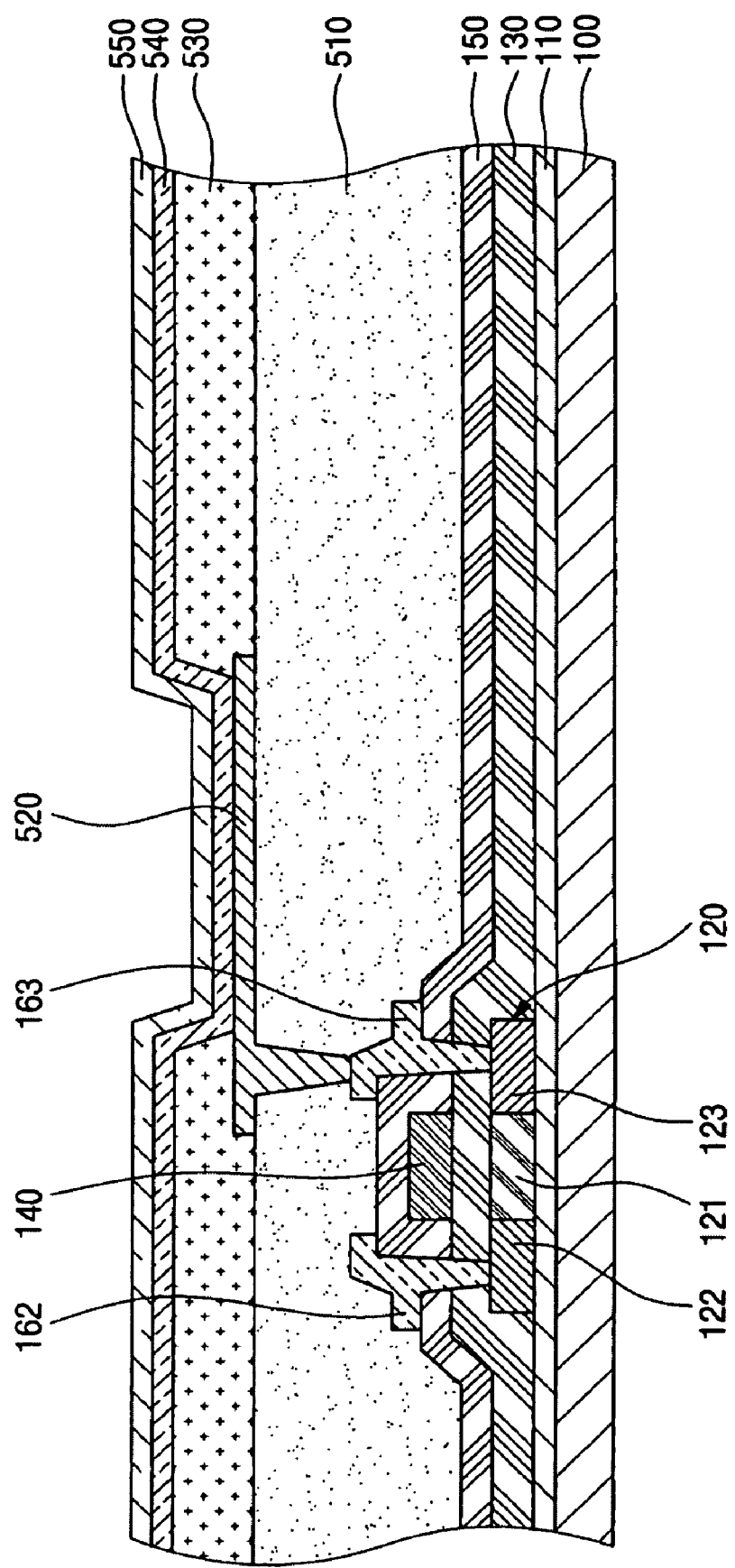
FIG. 5 is a cross-sectional view of an organic light emitting diode (OLED) display device including a thin film transistor according to another embodiment of the present invention.

FIG. 5 is a cross-sectional view of an organic light emitting diode (OLED) display device including a thin film transistor according to an exemplary embodiment of the present invention.

Referring to FIG. 5, an insulating layer 510 is formed on the entire surface of the substrate 100 including the thin film transistor according to the embodiment of FIG. 1. The insulating layer 510 may be formed of one selected from the group consisting of a silicon oxide layer, a silicon nitride layer and spin on glass layer, which are inorganic layers, or one selected from the group consisting of polyimide, benzocyclobutene series resin and acrylate, which are organic layers. Also, the insulating layer may be formed of a stacked layer thereof.

The insulating layer 510 may be etched to form a via hole exposing the source or drain electrode 162 or 163. A first electrode 520 is connected to one of the source and drain electrodes 162 and 163 through the via hole. The first electrode 520 may be formed as an anode or a cathode. When the first electrode 520 is an anode, the anode may be a transparent conductive layer formed of one selected from the group consisting of indium-tin-oxide (ITO), indium-zinc-oxide (IZO), and indium-tin-zinc-oxide (ITZO), and when the first electrode 520 is a cathode, the cathode may be formed of Mg, Ca, Al, Ag, Ba or an alloy thereof.

A pixel defining layer 530 having an opening exposing a portion of a surface of the first electrode 520 is formed on the first electrode 520, and an organic layer 540 including a light emitting layer is formed on the exposed first electrode 520. One or more layers selected from the group consisting of a hole injecting layer, a hole transport layer, a hole blocking layer, an electron blocking layer, an electron injection layer, and an electron transport layer may be further included in the organic layer 540. Sequentially, a second electrode 550 is formed on the organic layer 540. As a result, an OLED display device according to an exemplary embodiment of the present invention is fabricated.

Therefore, in the channel region of the semiconductor layer of the thin film transistor and the OLED display device according to an embodiment of the present invention, a metal catalyst for crystallization exists up to 150 Å from a surface of the semiconductor layer at a concentration of $6.5 \times E^{17}$ atoms per $cm^3$ or lower, so that a current leakage value $I_{off}$ (A/μm) per unit length 1 μm becomes $4.0\ E^{-13}$ A/μm or lower. Accordingly, when a thin film transistor is used in a display, excellent electrical characteristics are exhibited.

According to aspects of the present invention, in a thin film transistor and an OLED display device using a semiconductor layer crystallized by a metal catalyst, the concentration of the metal catalyst is adjusted depending on the location of a channel region, thereby providing a thin film transistor having excellent electrical characteristics, a method of fabricating the same, an OLED display device, and a method of fabricating the same.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
a substrate;
a semiconductor layer disposed on the substrate, including a channel region and source and drain regions, and crystallized using a metal catalyst;
a gate electrode disposed to correspond to a predetermined region of the semiconductor layer;
a gate insulating layer disposed between the gate electrode and the semiconductor layer to insulate the semiconductor layer from the gate electrode; and
source and drain electrodes electrically connected to the source and drain regions of the semiconductor layer,
wherein the metal catalyst is present in the channel region of the semiconductor layer at a concentration exceeding 0 and not exceeding $6.5 \times E^{17}$ atoms per $cm^3$ within 150 Å in a vertical direction,
wherein the vertical direction starts from a surface of the semiconductor layer that is on an opposite side of the substrate and extends towards the substrate, and
wherein the metal catalyst is present in the channel region at a concentration exceeding $6.5 \times E^{17}$ atoms per $cm^3$, at a depth exceeding 150 Å in the vertical direction.

2. The transistor of claim 1, wherein the channel region of the semiconductor layer has a concentration gradient in which the concentration of the metal catalyst within 150 Å from the surface of the semiconductor layer increases in proportion to the distance from the surface of the semiconductor layer.

3. The transistor of claim 1, wherein the semiconductor layer is crystallized by a Super Grain Silicon (SGS) method.

4. The transistor of claim 1, wherein the thin film transistor has a current leakage value $I_{off}$ (A/μm) per unit length 1 μm exceeding 0 and not exceeding $4.0\ E^{13}$ A/μm.

5. An organic light emitting diode (OLED) display device, comprising:
a substrate;
a semiconductor layer disposed on the substrate, including a channel region and source and drain regions, and crystallized using a metal catalyst;
a gate electrode disposed to correspond to the channel region of the semiconductor layer;
a gate insulating layer disposed between the gate electrode and the semiconductor layer to insulate the semiconductor layer from the gate electrode;
source and drain electrodes electrically connected to the source and drain regions of the semiconductor layer, respectively;
a first electrode electrically connected to one of the source and drain electrodes;
an organic layer including a light emitting layer disposed on the first electrode; and
a second electrode disposed on the organic layer,
wherein the metal catalyst is present in the channel region of the semiconductor layer at a concentration exceeding 0 and not exceeding $6.5 \times E^{17}$ atoms per $cm^3$ within 150 Å in a vertical direction,
wherein the vertical direction starts from a surface of the semiconductor layer that is on an opposite side of the substrate and extends towards the substrate, and
wherein the metal catalyst is present in the channel region at a concentration exceeding $6.5 \times E^{17}$ atoms per $cm^3$, at a depth exceeding 150 Å in the vertical direction.

6. The OLED display device of claim 5, wherein the channel region of the semiconductor layer has a concentration gradient in which the concentration of the metal catalyst within 150 Å from the surface of the semiconductor layer increases in proportion to the distance from the surface of the semiconductor layer.

7. The OLED display device of claim 5, wherein the semiconductor layer is crystallized by an SGS method.

8. The OLED display device of claim 5, wherein the thin film transistor has a current leakage value $I_{off}$(A/μm) per unit length 1 μm exceeding 0 and not exceeding $4.0\ E^{13}$ A/μm.

9. A semiconductor layer of a thin film transistor including a channel region and source and drain regions, and crystallized using a metal catalyst; wherein the metal catalyst is present in the channel region of the semiconductor layer at a concentration exceeding 0 and not exceeding $6.5 \times E^{17}$ atoms per $cm^3$ within 150 Å from a surface of the semiconductor layer that is on an opposite side of the substrate in a vertical direction extending towards the substrate,
wherein the metal catalyst is present in the channel region at a concentration exceeding $6.5 \times E^{17}$ atoms per $cm^3$, at a depth exceeding 150 Å in the vertical direction.

10. The semiconductor layer of claim 9, wherein the channel region has a concentration gradient in which a concentration of the metal catalyst within 150 Å from the surface of the semiconductor layer increases in proportion to the distance from the surface of the semiconductor layer.

11. The semiconductor layer of claim 9, wherein the semiconductor layer is crystallized by a Super Grain Silicon (SGS) method.

12. The semiconductor layer of claim 9, having a current leakage value $I_{off}$(A/μm) per unit length 1 μm exceeding 0 and not exceeding $4.0^{-13}$ A/μm.

* * * * *